United States Patent [19]

Wojnarowski

[11] Patent Number: 5,324,687

[45] Date of Patent: Jun. 28, 1994

[54] METHOD FOR THINNING OF INTEGRATED CIRCUIT CHIPS FOR LIGHTWEIGHT PACKAGED ELECTRONIC SYSTEMS

[75] Inventor: Robert J. Wojnarowski, Ballston Lake, N.Y.

[73] Assignee: General Electric Company, Schenectady, N.Y.

[21] Appl. No.: 962,379

[22] Filed: Oct. 16, 1992

[51] Int. Cl.⁵ .................. H01L 21/302; H01L 21/463
[52] U.S. Cl. .................................. 437/225; 437/207; 437/209; 437/974
[58] Field of Search ............ 437/8, 209, 207, 219, 437/220; 257/668, 700, 701, 671, 669, 684, 693, 680, 687, 688, 702, 707, 709, 724, 731, 752

[56] References Cited

U.S. PATENT DOCUMENTS

| | | | |
|---|---|---|---|
| 3,903,590 | 9/1975 | Yokogawa | 257/724 |
| 4,450,652 | 5/1984 | Walsh | 51/131.4 |
| 4,714,516 | 12/1987 | Eichelberger et al. | 156/628 |
| 4,764,485 | 8/1988 | Loughran et al. | 437/225 |
| 4,780,177 | 10/1988 | Wojnarowski et al. | 156/643 |
| 4,783,695 | 11/1988 | Eichelberger et al. | 357/65 |
| 4,793,895 | 12/1988 | Kaanta et al. | 156/627 |
| 4,835,704 | 5/1989 | Eichelberger et al. | 364/490 |
| 4,842,677 | 6/1989 | Wojnarowski et al. | 156/643 |
| 4,866,501 | 9/1989 | Shanefield | 257/672 |
| 4,878,991 | 11/1989 | Eichelberger et al. | 156/630 |
| 4,884,122 | 11/1989 | Eichelberger et al. | 357/71 |
| 4,894,115 | 1/1990 | Eichelberger et al. | 156/643 |
| 4,907,062 | 3/1990 | Fukushima | 257/684 |
| 4,937,203 | 6/1990 | Eichelberger et al. | 437/51 |
| 5,016,084 | 5/1991 | Nakao | 257/693 |
| 5,019,946 | 5/1991 | Eichelberger et al. | 361/414 |
| 5,051,378 | 9/1991 | Yagi et al. | 437/225 |
| 5,155,068 | 10/1992 | Tada | 437/211 |

*Primary Examiner*—Robert Kunemund
*Assistant Examiner*—H. Jey Tsai
*Attorney, Agent, or Firm*—Geoffrey H. Krauss

[57] ABSTRACT

A method of thinning dice or integrated circuit chips used in producing lightweight packaged electronic systems, such as HDI circuits and systems produced therefrom provides for positioning dice in a die carrier layer that allows for easy separation from the dice after completion of the die thinning step. A holding layer is then attached to the die carrier layer for ease of attaching it to a material removal device, such as a lapping machine or an ultrasonic milling machine. A portion of the die carrier layer, along its exposed side, is then removed by the material removal device as a consequence of removal, by the material removal device, of an expendable portion of the dice positioned within the die carrier layer. The holding layer and the die carrier layer are then separated from the thinned dice by a conventional method, such as chemical etching, solvent soaking or induction heating. The thinned dice are significantly lighter than their original weight and their uniform thickness makes them well suited for mass produced lightweight electronic systems and flexible assemblies, such as HDI circuits.

15 Claims, 9 Drawing Sheets

METHOD FOR THINNING OF INTEGRATED CIRCUIT CHIPS FOR LIGHTWEIGHT PACKAGED ELECTRONIC SYSTEMS

CROSS-REFERENCE TO RELATED APPLICATIONS

The present application is related to copending commonly assigned patent applications Ser. No. 07/504,769, filed Apr. 5, 1990 now abandoned in favor of application Ser. No. 07/865,786, filed Apr. 7, 1992, and entitled "Flexible High Density Interconnect Structure and Flexibly Interconnected System"; Ser. No. 07/962,000, filed Oct. 16, 1992 and entitled "Wafer Level Integration and Testing"; Ser. No. 07/962,449, filed Oct. 16, 1992 and entitled "Integrated Circuit Chip Placement in a High Density Interconnect Structure"; and to commonly assigned allowed patent application Ser. No. 07/504,749, filed Apr. 5, 1990, and entitled "High Density Interconnect Structure with Top Mounted Components", all of which are incorporated herein by reference.

FIELD OF THE INVENTION

This invention relates to multi-component or multi-chip circuits and, more particularly, to high density interconnect circuits comprising multiple components or chips that are thinned to a uniform thickness, and may be made flexible.

BACKGROUND OF THE INVENTION

HDI (High Density Interconnect) circuits of the type comprising a plurality of interconnected circuit chips mounted on a substrate where the chips are interconnected by a metallized pattern created on a polymer overlayer are described by Eichelberger et al. in a commonly assigned U.S. Pat. No. 4,783,695, issued Nov. 8, 1988 and incorporated herein by reference. Typically, the metallized pattern is formed by a computer-controlled laser lithography system, described in a commonly assigned U.S. Pat. No. 4,835,704, issued May 30, 1989 and incorporated herein by reference. Typically, a high density interconnect structure employs between thirty and fifty or more integrated circuit chips that are assembled and interconnected on a single HDI substrate having a width and length of about 50 millimeters (mm) and a thickness of about 1.27 mm.

The aforementioned HDI structure can be disassembled for repair or replacement of a faulty component and reassembled without significant risk to the good components incorporated within the system. Ease of repairability is an important consideration where fifty or more chips having a cost of as much as $2000 each may be supported on a single substrate. Exemplary testing and repair techniques are disclosed by Eichelberger et al. in U.S. Pat. Nos. 4,878,991, issued Nov. 7, 1989; 4,884,122, issued Nov. 28, 1898 and 4,937,203, issued Jun. 26, 1990, all incorporated herein by reference.

An important objective of the HDI technology is to produce flexible HDI circuit packages or modules that contain integrated circuit chips or dice of uniform thicknesses. Employment of uniformly thick dice provides a practical method by which HDI circuit packages can be mass produced, since it allows standardization of die pockets in which the dice are positioned in the substrates generally used for typical HDI circuit packages.

BRIEF SUMMARY OF THE INVENTION

One object of this invention is to provide an economical method of thinning dice used in HDI circuit configurations.

Another object of the invention is to provide an HDI circuit module of standardized shape and size suitable for mass production.

Another object of the present invention is to provide an HDI structure with a flexible portion that allows relative movement between different portions of an electronic system interconnected by that structure.

Yet another object of the invention is to provide a rugged, substrate-free flexible HDI circuit configuration that can be directly affixed to a surface of an object having either a flat or three-dimensional shape.

Still another object of the invention is to provide standardized, flexible HDI circuit packages that can be stacked to produce a lightweight high density three-dimensional interconnected structure.

Yet another object of the invention is to provide a lightweight HDI circuit package employing temperature-sensitive dice that are incapable of surviving temperatures encountered in fabricating such HDI circuit packages.

In one embodiment, the invention is directed to a method of thinning a die used in a packaged electronic system, the method comprising positioning one of the die in a die carrier layer, and removing a portion of the die to decrease its thickness.

In another embodiment, the invention is directed to a method of producing a lightweight flexible packaged electronic system comprising positioning a plurality of dice in a die carrier layer such that contact pads of the plurality of dice are coplanar with a face of the die carrier layer, bonding a flexible polymer dielectric film to the face of the die carrier layer and to the plurality of dice positioned in the die carrier layer, affixing a holding layer to the flexible polymer dielectric film, attaching the holding layer to a material removal device, removing from the exposed side of the die carrier layer an expendable portion of the die carrier layer along with an expendable portion of the plurality of dice positioned in the die carrier layer to decrease the thickness of the plurality of dice to a desired thickness, separating the die carrier layer from the flexible polymer dielectric film and the plurality of dice, bonding a substrate to the plurality of dice, removing the holding layer from the flexible polymer dielectric film, and depositing a pattern of flexible conductors on the flexible polymer dielectric film to electrically interconnect at least some of the contact pads of the plurality of dice.

The invention is further directed to a method of producing a stacked lightweight packaged electronic system comprising positioning a plurality of dice in a die carrier layer such that contact pads of the plurality of dice are coplanar with a face of the die carrier layer, bonding a polymer dielectric film to the face of the die carrier layer and to the plurality of dice positioned in the die carrier layer, affixing a holding layer to the polymer dielectric film, attaching the holding layer to a material removal device, removing from the exposed side of the die carrier layer an expendable portion of the die carrier layer along with an expendable portion of the plurality of dice positioned in the die carrier layer to decrease the thickness of the plurality of dice along with the die carrier layer to a desired measure, attaching a temporary transfer substrate to the thinned side of the die carrier layer, removing the holding layer form the polymer dielectric film, perforating the dielectric film to form via openings therein in alignment with at least some of the contact pads, depositing on the polymer dielectric film a pattern of conductors having edge contact pads to electrically interconnect at least some of the contact pads of the plurality of dice, removing the temporary transfer substrate from the thinned side of the die carrier layer to form a high density interconnect layer, and coating a top and bottom surface of the high density interconnect layer with an adhesive layer. The method further comprises stacking a plurality of the high density interconnect layers such that for any adjacent pair of the high density interconnect layers, the adhesive layers bond the top surface of one high density interconnect layer to the bottom surface of the other high density interconnect layer so as to form a unitary stacked module, bonding a substrate to the bottom surface of the lowermost high density interconnect layer, bonding a dielectric layer to at least one side of the stacked module having the edge contacts exposed thereon, perforating the dielectric layer to form apertures therein in alignment with at least some of the edge contact pads, and depositing a conductive metal track structure on the dielectric layer to provide electrical connection between at least some of the edge contact pads through the apertures in the dielectric layer, the metal track structure electrically interconnecting in a predetermined manner the dice positioned in the high density interconnect layers of the stacked module.

BRIEF DESCRIPTION OF THE DRAWINGS

The foregoing and other objects, aspects and advantages of the invention will be understood from the following detailed description of the invention with reference to the drawings, in which.

DETAILED DESCRIPTION OF THE PREFERRED EMBODIMENTS OF THE INVENTION

Figure 1:
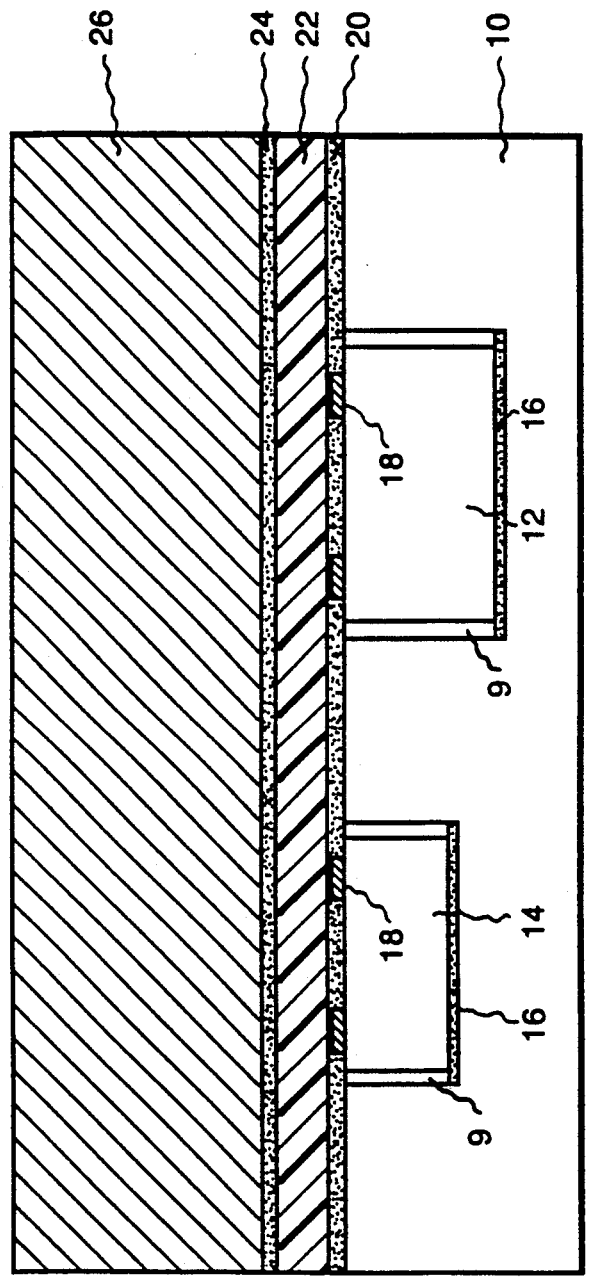
FIGS. 1 through 4 illustrate, in cross-sectional view, a preferred embodiment of the present invention that incorporates the process steps utilized in producing thinned dice.

FIGS. 1 through 4 show various process steps that disclose the method by which dice used in packaged electronic systems can be thinned to reduce their weight as well as thickness. Those elements in FIGS. 1 through 4 that do not undergo any physical changes during the process are referred to by the same reference numerals throughout to maintain clarity of description.

FIG. 1 illustrates a die carrier layer 10 having cavities or pockets 9 therein for accepting a die 12 and 14, each of which has a plurality of contact pads 18 thereon. The pockets may be machined by any conventional method, such as: mechanical milling, laser cutting or ultrasonic milling. An adhesive layer 16 is generally provided in each of the pockets within die carrier layer 10 to attach dice 12 and 14 in pockets 9. Adhesive layer 16 is preferably a thermoplastic adhesive, such as Ultem ® polyetherimide sold by General Electric Company, Pittsfield, Mass. Adhesive layer 16 should be capable of providing strong adhesion between dice 12 and 14 and the surface of the cavities in die carrier layer 10 during a die thinning step, described below. After placing dice 12 and 14 in the cavities of die carrier layer 10, the entire structure is heated to at least the softening point of the polyetherimide, about 217° C. to about 300° C. for low viscosity flow, and then cooled to thermoplastically bond dice 12 and 14 in the cavities in die carrier layer 10. As shown in FIG. 1, dice 12 and 14 are positioned in die carrier layer 10 such that upper surfaces of dice 12 and 14 that include contact pads 18 are substantially coplanar with a face of die carrier layer 10. Alternatively, the material for die carrier layer 10 may be poured around dice 12 and 14 to position them within die carrier layer 10 such that contact pads 18 are coplanar with the face of die carrier layer 10.

Die carrier layer 10 is comprised of any removable or dissolvable material that is capable of being separated from dice 12 and 14, if so desired, such as glass, ceramics, alumina, metal, metal alloy, or polymer. Metal is preferred. Metals such as molybdenum, Kovar, tungsten, or aluminum are quite suitable.

A polymer dielectric film 22, preferably of Kapton ® polyimide sold by E.I. du Pont de Nemours and Company, Wilmington, Del. and preferably having a thickness of about 0.5 mil to 3 mil, is pretreated to promote adhesion. It should be noted that polymer dielectric film 22 may be fabricated either of thermoplastic or thermosetting material. One side of polymer dielectric film 22 is preferably coated with an adhesive layer 20 of Ultem polyetherimide resin or some other suitable thermoplastic resin and then bonded to the surfaces of die carrier layer 10. Adhesive layer 20 serves to hold polymer dielectric film 22 in place. Preferably, the bonding of polymer film 22 to die carrier layer 10 is conducted under vacuum conditions to prevent air entrapment between the film and the face of the die carrier layer, thereby improving adhesion between them.

At this stage, the exposed face of polymer dielectric film 22 is RIE treated for adhesion. Layer 24 is an Ultem polyetherimide resin or some suitable thermoplastic resin to attach it to a holding layer 26 comprised of a material that is capable of being selectively separated by application of heat or by dissolution from the exposed face of polymer dielectric film 22, after completion of the die thinning step described below. Examples of other suitable thermoplastic resins for layer 24 are polyester, polyimide, or acrylate polymer resins. Resin layer 24 may be prepared by any one of a number of conventional methods, such as by spraying the resin, or by bonding a film of the resin, onto the exposed surface of polymer dielectric film 22.

Holding layer 26 is generally comprised of structurally strong, stiff material, such as metal, polymer or alumina. Magnetic metal is preferred. If holding layer 26 is comprised of a polymer material, it is preferably plated strength and stiffness. Holding layer 26 is preferably comprised of Kovar alloy plated with a nickel layer to prevent corrosion. Kovar alloy generally comprises about 53.8% iron, about 29% nickel, about 17% cobalt, and about 0.2% manganese. Nickel-coated Kovar alloy advantageously is readily dissolvable in ferric chloride solution. Holding layer 26 is prepared by conventional methods, such as machining, casting, molding and the like, and is preferably provided with a smooth surface for bonding to the exposed face of polymer dielectric film 22. If desired, holding layer 26 may be further provided with mounting holes or any other fastening means by which the die thinning step described below may be facilitated.

To begin the die thinning step, holding layer 26 is attached along its exposed side to a material removal device (not shown) by mechanical fasteners, such as nuts and bolts; by bonding, or by magnetic means, such as a magnetic chuck. The exposed side of die carrier layer 10 containing dice 12 and 14 is then subjected to die thinning. During the die thinning step, an expendable portion from the exposed side of die carrier layer 10 along with the expendable portion of dice 12 and 14 positioned in die carrier layer 10 are removed to decrease the thickness of dice 12 and 14 along with the thickness of die carrier layer 10 to a desired measure.

Figure 2:
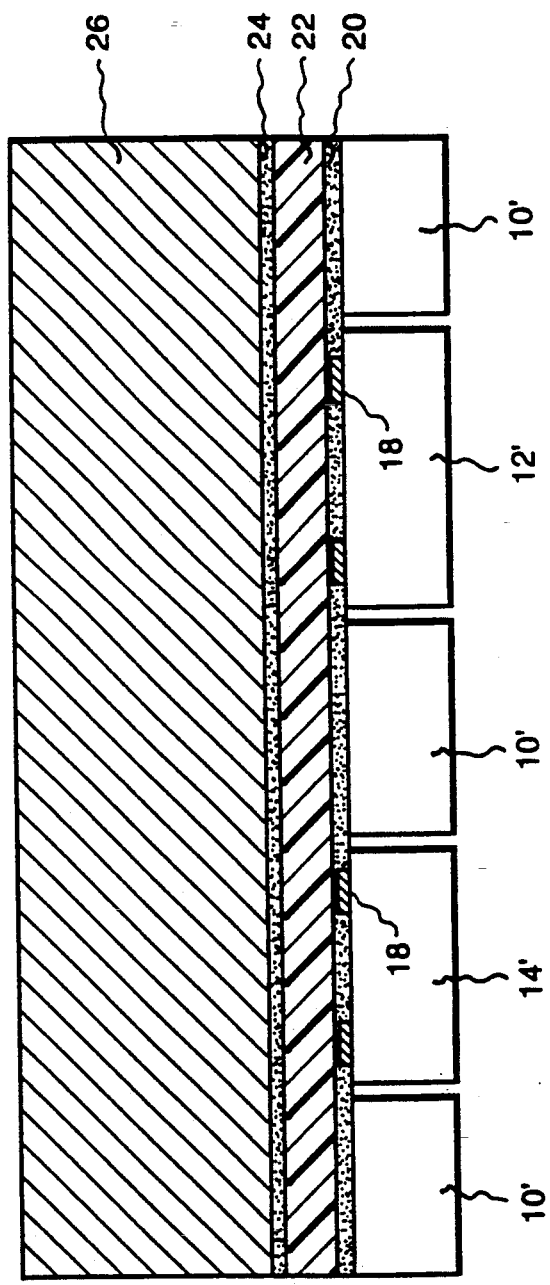

FIG. 2 shows a thinned die carrier layer 10' and thinned dice 12' and 14' after completion of the die thinning operation. As seen in FIG. 2, thinned die carrier layer 10' is preferably coplanar with thinned dice 12' and 14'; alternatively, however, dice 12 and 14 of FIG. 1 may be thinned to different desired thicknesses by providing suitable programming to the material removal device (not shown). The material removal device is generally of a conventional type, such as a lapping machine, ultrasonic milling, micro blasting, milling machine, laser cutting machine or other suitable machining device. Ultrasonic milling is preferred, especially for mass producing thinned dice by the process of the present invention. So long as the functions of dice 12 and 14 are unaffected they may generally be thinned by any desired amount, typically by about 5% to about 30% of their original weight.

Figure 3:
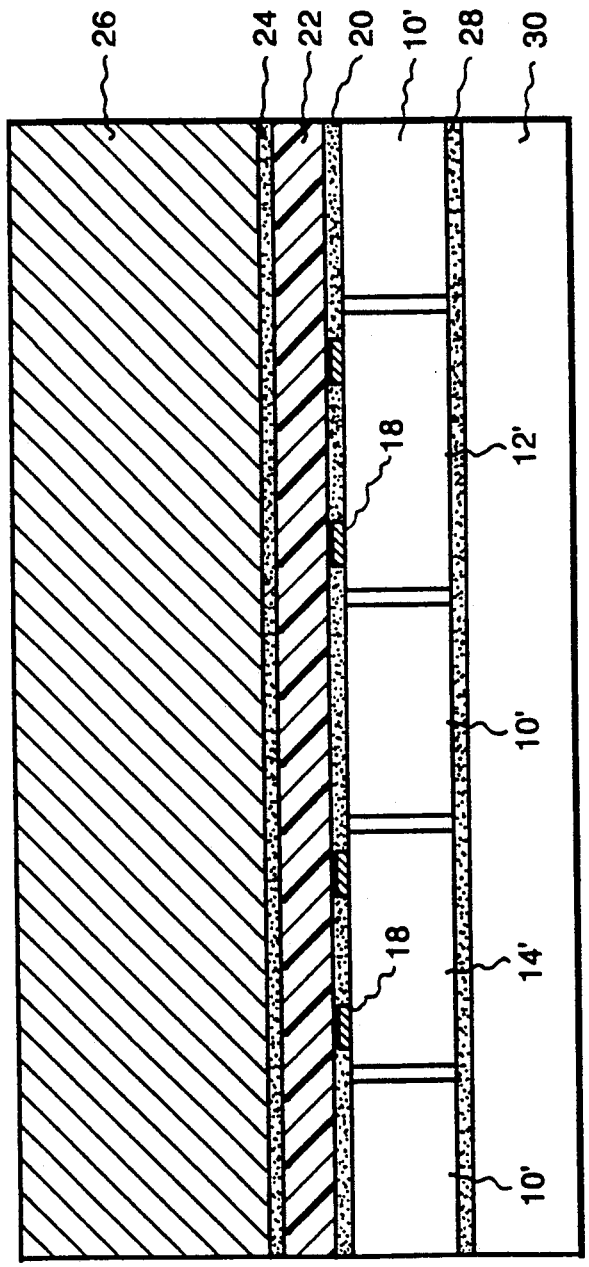

Upon completion of the die thinning process, the thinned surface of die carrier layer 10' having thinned dice 12' and 14' positioned therein, are solvent and water cleaned. FIG. 3 illustrates layer 30 with an adhesive layer 28 comprised of an adhesive similar to those used for adhesive layer 20. Adhesive layer 28 may be applied by conventional means to layer 30, such as screen printing, pad printing, transfer printing, dipping, spraying or film insertion. During the application of adhesive layer 28, holding layer 26 may be attached, for example, to a pad printing machine (not shown), which is also suitable for mass production of packaged electronic systems.

As shown in FIG. 3, a substrate 30 is next bonded to adhesive layer 28 which, in accordance with the invention, acts as a base or heat sink for the completed packaged electronic system having thinned dice 12' and 14' positioned therein. In accordance with the process of the present invention, the thickness of substrate 30 may be, for example, about 0.635 mm to about 2.54 mm (about 25 mils to about 100 mils). Substrate 30 may be comprised of materials such as alumina ($Al_2O_3$), which is preferred, or aluminum nitride (AlN).

Figure 4:
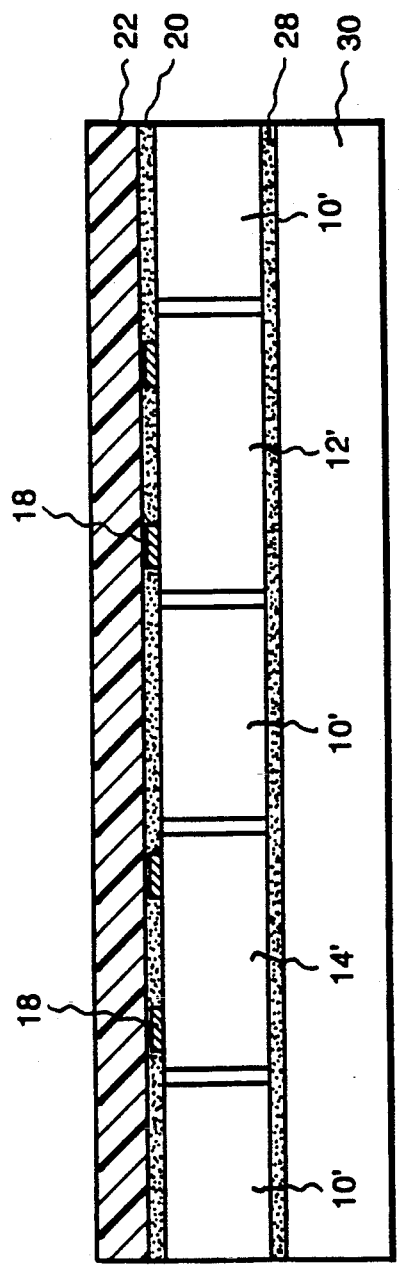

After substrate 30 has been bonded to adhesive layer 28, holding member 26 is detached from polymer dielectric film 22, as seen in FIG. 4, by any one of a number of conventional methods. For example, the holding member may be chemically or electrochemically etched away, or it may be heated for detachment from polymer dielectric film 22. Induction heating is preferred.

Upon completion of the above process steps, a conventional monolayered or multilayered HDI structure, described hereinbelow, may be built up on polymer dielectric film 22 to electrically connect the electrical components, such as dice 12' and 14', into an actual functioning system.

The die thinning process of the invention is well suited for mass production of packaged electronic systems, such as an HDI circuit configuration that utilizes standardized dice of uniform thickness and size. It is well known that dice produced by different manufacturers, even when made to the same specifications, vary in their thicknesses. Such thickness variations, even small amounts, can create significant difficulties in mass production of packaged HDI circuits. Thus, it would be singularly desirable to produce dice of uniform thickness, since die pockets in an HDI substrate must be customized for each die thickness. Die pocket machining is one of the more expensive and time consuming aspects of manufacturing a packaged HDI circuit. The present die thinning process is well suited for mass production of HDI circuits that utilized HDI substrates having standardized pocket depths for die placement in that it eliminates the expensive and time consuming step of machining customized die pockets in an HDI substrate.

The aforementioned die thinning process may be simplified for mass production of dice of uniform thickness. After positioning dice in a die carrier layer in the manner described above, the die carrier layer is directly affixed, preferably by means of an adhesive layer, to a holding layer which is then attached to a material removal device. The material removal device removes a portion of the die carrier layer along with an expendable portion of the dice. The remaining portion of the die carrier layer is then removed by any one of the aforementioned methods, such as soaking in a solvent or chemically etching. The thinned dice are then detached from the holding layer by conventional methods, such as, for example, induction heating.

Figure 5:
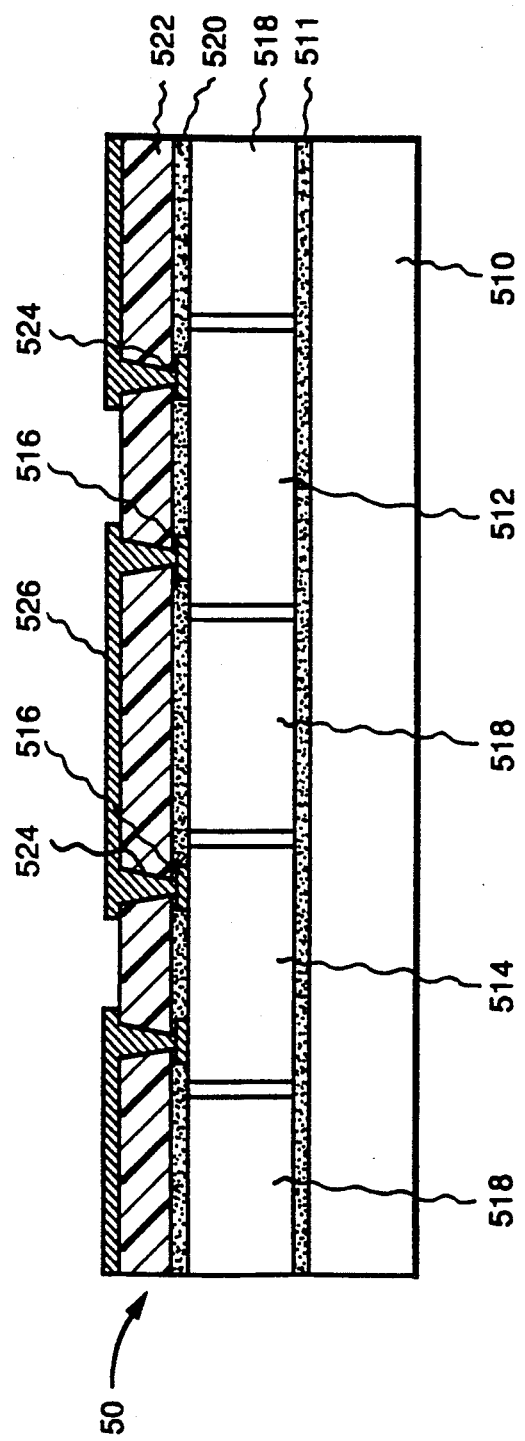
FIG. 5 is a cross-sectional view of a packaged electronic system that includes thinned dice produced by the process of a preferred embodiment of the invention.

FIG. 5 shows a lightweight packaged electronic system 50 having dice 512 and 514 that have been thinned in accordance with the invention. Thinned dice 512 and 514 are positioned within a die carrier layer 518 that has previously been thinned along with thinned dice 512 and 514 in accordance with the invention. Contact pads 516 of dice 512 and 514 are coplanar with a face of die carrier layer 518. A polymer dielectric film 522, similar to polymer dielectric film 22 shown in FIGS. 1 through 4, is preferably bonded through an adhesive layer 520 to the face of die carrier layer 518 that includes die contact pads 516. A substrate 510, similar to substrate 30 shown in FIGS. 3 and 4, is then bonded through an adhesive layer 511 (similar to adhesive layer 28 of FIGS. 3 and 4) to die carrier layer 518 and thinned dice 512 and 514. A monolayered or multilayered HDI overcoat structure is thereafter provided on polymer dielectric film 522 by first perforating the film and adhesive layer 520 underneath the film, preferably by use of a laser beam, to form via openings 524 aligned with at least some of contact pads 516 on dice 512 and 514. Exemplary laser milling techniques are disclosed by Eichelberger et al. in commonly assigned U.S. Pat. Nos. 4,714,516 and 4,894,115, issued Dec. 22, 1987 and Jan. 16, 1990, respectively; and by Loughran et al. in commonly assigned U.S. Pat. No. 4,764,485, issued Aug. 16, 1988, each of which patent is hereby incorporated herein by reference.

Buildup of lightweight packaged electronic system 50 continues by depositing a pattern of conductors 526 on polymer dielectric film 522 to electrically connect at least some of contact pads 516 of dice 512 and 514, through via openings 524. Conductors 526 may be patterned to form individual conductors while they are being applied over film 522, or they may be applied as a continuous layer and then patterned using conventional photoresist and etching techniques. In using photoresist, a laser beam which is scanned relative to substrate 510 is preferably used to expose the resist in order to provide an accurately aligned pattern of conductors 526. Conductors 526 further comprise a layer of titanium (not shown) in direct contact with polymer dielectric film 522 and a layer of highly ductile copper (not shown) deposited over the layer of titanium. Exemplary techniques for forming conductors 526 are disclosed by Wojnarowski et al. in commonly assigned U.S. Pat. Nos. 4,780,177 and 4,842,677, issued Oct. 25, 1988 and Jun. 27, 1989, respectively, and by Eichelberger et al. in commonly assigned U.S. Pat. No. 4,835,704, issued May 30, 1989, each of which patent is incorporated herein by reference. Any misalignment of individual electronic components, such as dice 512 and 514 and their contact pads 516, is compensated for through an adaptive laser lithography system as disclosed in the aforementioned U.S. Pat. No. 4,835,704.

Additional polymer dielectric films, via openings, and patterns of conductors may be provided as required on film 522 to provide all of the desired electrical connections between dice 512 and 514. Additional polymer dielectric films with the necessary patterns of conductors thereon may be provided, if desired, over film 522 and conductors 526.

Figure 6:
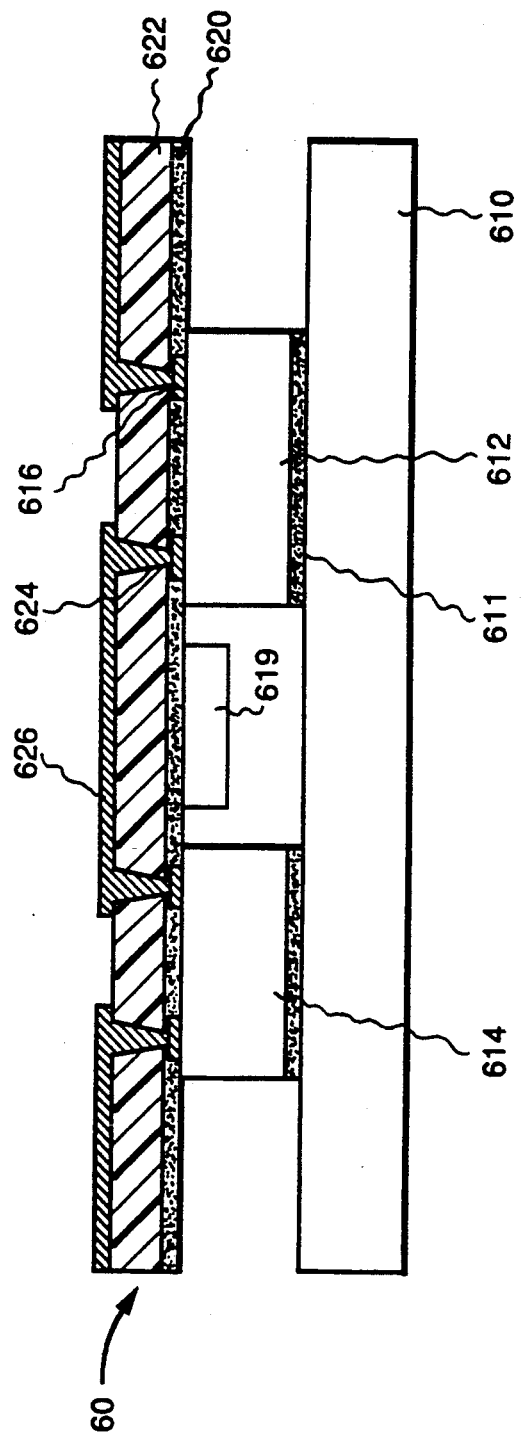
FIG. 6 is a cross-sectional view of a lightweight flexible packaged electronic system that includes thinned dice produced by the process of a preferred embodiment of the invention.

In another embodiment of the invention, as shown in FIG. 6, a lightweight packaged electronic system 60 produced by the process of the present invention includes dice 612 and 614 of a desired thickness after having been thinned by the aforementioned die thinning process illustrated by FIGS. 1-3. Electronic system 60 is depicted after a die carrier layer, used during the aforementioned die thinning process, has been removed by a conventional method such as etching, laser cutting, solvent soaking or selective heating. Thus, dice 612 and 614 are shown thinned to a desired thickness and bonded by adhesive layers 620 and 611 to a polymer dielectric film 622 and a substrate 610, respectively. Via openings 624 aligned with at least some of contact pads 616 of dice 612 and 614 are provided in polymer dielectric film 622 in the manner previously described. A pattern of conductors 626 is deposited on polymer dielectric film 622 to electrically connect through via openings 624 at least some of contact pads 616 of dice 612 and 614. If necessary, polymer dielectric film 622 may be provided with added structural strength by use of a spacer 619 which may be formed by selectively leaving a portion of the die carrier layer adhered to polymer dielectric film 622 through adhesive layer 620 or by bonding thereto a separate insert which may be comprised of polymer, alumina, metal or metal alloys. By thus eliminating the die carrier layer completely or substantially completely, the weight of electronic system 60 is significantly reduced.

Figure 7:
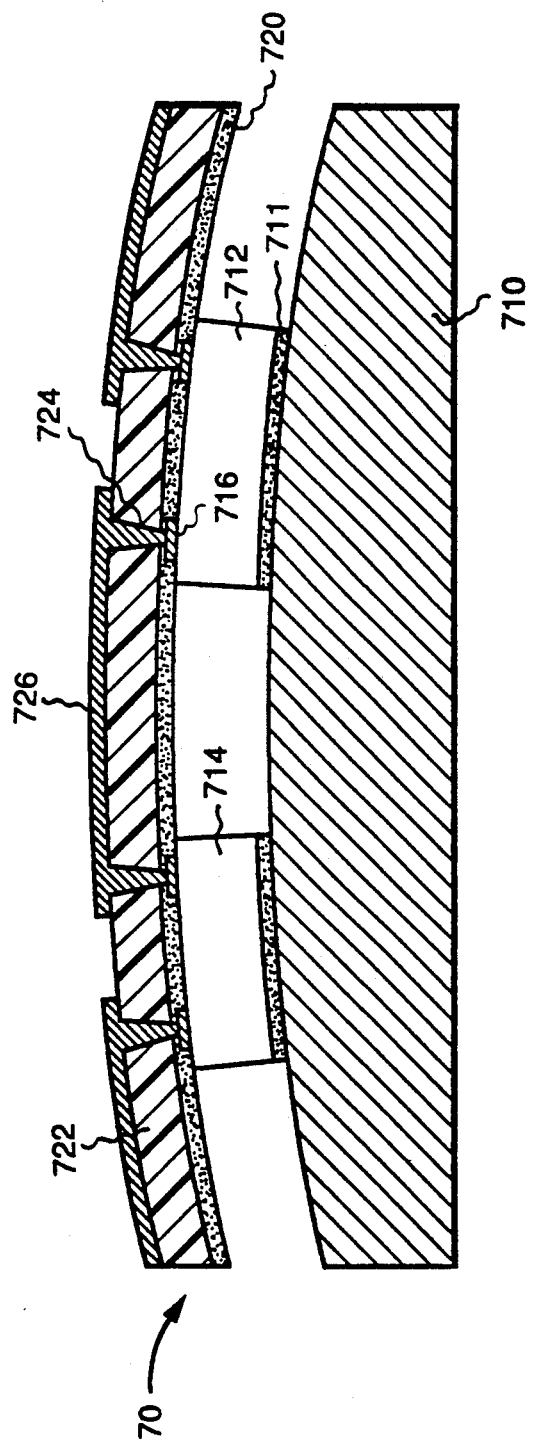
FIG. 7 is a cross-sectional view of a lightweight flexible packaged electronic system that includes thinned dice produced by the process of a preferred embodiment of the invention, the system utilizing as a heat sink a device having a curved surface.

In yet another embodiment of the present invention, as shown in FIG. 7, a lightweight flexible packaged electronic system 70 is produced by the process of the present invention. Dies 712 and 714 of a desired thickness are shown after having been thinned by the aforementioned die thinning process illustrated by FIGS. 1-3. Electronic system 70 is shown after a die carrier layer, used during the aforementioned die thinning process, has been removed by a conventional method such as etching, laser cutting, solvent soaking or selective heating. Thus thinned dice 712 and 714 are shown bonded by adhesive layers 720 and 711 to a flexible polymer dielectric film 722 and a substrate 710, respectively, the substrate having a curvature, shown as convex; however, electronic system 70 may alternatively be attached to a flat substrate or to a substrate having various other shapes or curvatures, including concave. Via openings 724 aligned with at least some of contact pads 716 of dice 712 and 714 are provided in flexible polymer dielectric film 722 in the manner previously described. A pattern of flexible conductors 726 is deposited on flexible polymer dielectric film 722 to electrically interconnect, through via openings 724, at least some of contact pads 716 of dice 712 and 714. If necessary, polymer dielectric film 722 may be provided with additional structural strength by use of a spacer (not shown). Such spacer may be formed as described in conjunction with the embodiment of FIG. 6.

Substrate 710 used in the aforementioned lightweight flexible packaged electronic system 70 of FIG. 7 may be a heat sink or a part of a device subjected to high acceleration and high deceleration forces. It is further contemplated that the exposed surface of flexible polymer dielectric film 722 having flexible interconnection conductors 726 thereon may be provided with means for inserting a temperature-sensitive die. Application Ser. No. 07/504,749 provides further detail concerning high density interconnect structures having top-mounted temperature sensitive components therein.

The lightweight flexible packaged electronic system shown in FIG. 7 may be provided with a plurality of dice, some of which comprise dummy spacer dice of the same size as dice that are sensitive to the process temperatures typically experienced during the aforementioned die thinning process. Consequently, upon completion of electronic system 70, such dummy spacer dice may be removed and replaced in the system by process temperature-sensitive dice. A typical process for removing and replacing defective dice in HDI components can similarly be utilized here to replace the dummy spacer dice. Commonly assigned Eichelberger et al. U.S. Pat. No. 4,878,991, issued Nov. 7, 1989, discloses such a process. Electronic system 70, having temperature-sensitive dice therein, is most suitable in HDI components used in heads-up displays, scanners or sensors. It should be understood, however, that temperature-sensitive dice may be similarly employed in any of the other embodiments of the present invention.

The method of the present invention is also suitable for producing a stacked lightweight packaged electronic system provided with a plurality of high density interconnect layers containing thinned (and hence lightweight) dice. One of the deviations from the aforementioned process is that, in the fabrication of a stacked lightweight packaged electronic system, after the die thinning step, and while a thinned die carrier layer (similar to thinned die carrier layer 10' shown in FIG. 2) containing thinned dice and having a polymer dielectric film bonded thereon is still affixed to a holding layer, a temporary transfer substrate (similar to substrate 30 shown in FIG. 3), is attached along the thinned side of the die carrier layer having thinned dice therein. The holding layer is then removed in the manner described previously, and a pattern of conductors having edge contact pads is deposited on the polymer dielectric film by the aforementioned deposition steps to electrically connect, through perforated via openings in the polymer dielectric film, at least some of the contact pads of the thinned dice positioned in the thinned die carrier layer. After deposition of the pattern of conductors having edge contact pads, the temporary transfer substrate is removed to form an aforementioned high density interconnect layer.

A top and bottom surface of the high density interconnect layer thus formed is coated with an adhesive layer, similar to adhesive layer 28 in the FIGS. 3 and 4 embodiments. A plurality of such high density interconnect layers, each having such adhesive layers on its top and bottom surfaces, are then stacked so that, for any adjacent pair of such high density interconnect layers, the adhesive layers bond the top surface of one high density interconnect layer to the bottom surface of the other high density interconnect layer to form a unitary stacked module. The unitary stacked module may have a polyhedral shape, and a cubic shape is preferred. The bottom surface of the lowermost high density interconnect layer is then bonded to a substrate similar to substrate 30 in the FIGS. 3 and 4 embodiments.

A dielectric layer is next bonded, preferably by an adhesive layer, to at least one side of the unitary stacked module having the edge contacts of the patterns of conductors exposed along the sides of the module. The dielectric layer is similar to the aforementioned polymer dielectric film and is bonded by methods similar to those previously described. The dielectric layer is then perforated by the aforementioned laser milling process to form apertures aligned with at least some of the edge contact pads.

A conductive metal track structure is next deposited on the dielectric layer by the deposition method previously described, to provide electrical connection between at least some of the edge contact pads of the pattern of conductors through the apertures in the dielectric layer. The conductive metal structure electrically interconnects in a predetermined manner the thinned dice positioned in the high density interconnect layers of the stacked module.

Figure 8:
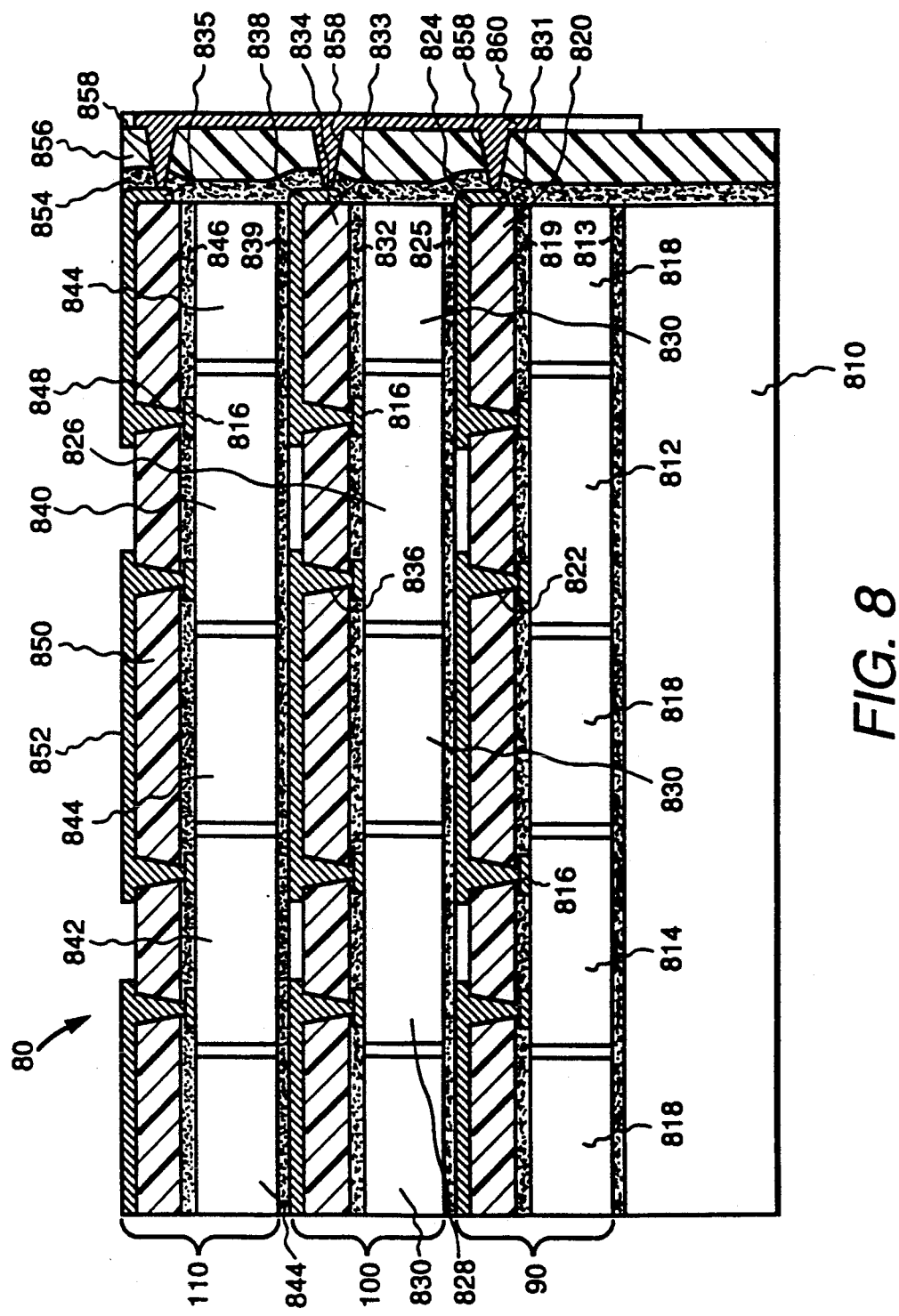
FIG. 8 is a cross-sectional view of a stacked lightweight packaged electronic system that includes thinned dice produced by the process of a preferred embodiment of the invention.

FIG. 8 illustrates one example of a stacked lightweight packaged electronic system 80 produced in accordance with the invention. Electronic system 80 is shown with three high density interconnect layers 90, 100 and 110 although more or less than three high density interconnect layers may be provided therein.

Lowermost high density interconnect layer 90 comprises a thinned die carrier layer 818 in which thinned dice 812 and 814 having contact pads 816 are positioned in coplanar relationship with a top face of thinned die carrier layer 818. The top and bottom faces of thinned die carrier layer 818 are coated with adhesive layers 819 and 813, respectively. A substrate 810 is bonded to the bottom face and a polymer dielectric film 820 is bonded to the top face of thinned die carrier layer 818, which is then provided with via openings 822. A pattern of conductors 824 having edge contact pads 831 of the type shown and described, for example, in commonly assigned Eichelberger et al. U.S. Pat. No. 5,019,946, issued May 28, 1991, is deposited on polymer dielectric film 820 to form high density interconnect layer 90.

A high density interconnect layer 100 is stacked on polymer dielectric film 820 of high density interconnect layer 90. An adhesive layer 825 bonds a bottom surface of high density interconnect layer 100 to the top surface of high density interconnect layer 90. High density interconnect layer 100 is provided with thinned dice 826 and 828 positioned in a thinned die carrier layer 830. An adhesive layer 832 is positioned between the top face of thinned die carrier layer 830 and a polymer dielectric film 834 having a pattern of conductors 838 with edge contact pads 833. Conductors 838 are connected, through via openings 836, to at least some of contact pads 816 of thinned dice 826 and 828.

A high density interconnect layer 110 is stacked on a top surface of high density interconnect layer 100. An adhesive layer 839 bonds the bottom surface of high density interconnect layer 110 to the top surface of high density interconnect layer 100. High density interconnect layer 110 is provided with thinned dice 840 and 842 positioned in a thinned die carrier layer 844. A polymer dielectric film 850 is positioned on a top face of thinned die carrier layer 844. A pattern of conductors 852 with edge contact pads 835 connected, through via openings 848, to at least some of contact pads 816 of thinned dice 840 and 842 is deposited on polymer dielectric film 850. The assembly as thus completed forms a unitary stack module of the stacked lightweight packaged electronic system 80.

A dielectric layer 856 is preferably bonded by through an adhesive layer 854 to a side of the aforementioned unitary stack module. A conductive metal track structure 860, positioned on the exposed side of dielectric layer 856, electrically connects, through apertures 858, at least some of the edge contact pads of the patterns of conductors 852, 838 and 824. The stacked lightweight packaged electronic system 80 is especially well suited to form a stacked memory unit.

Figure 9:
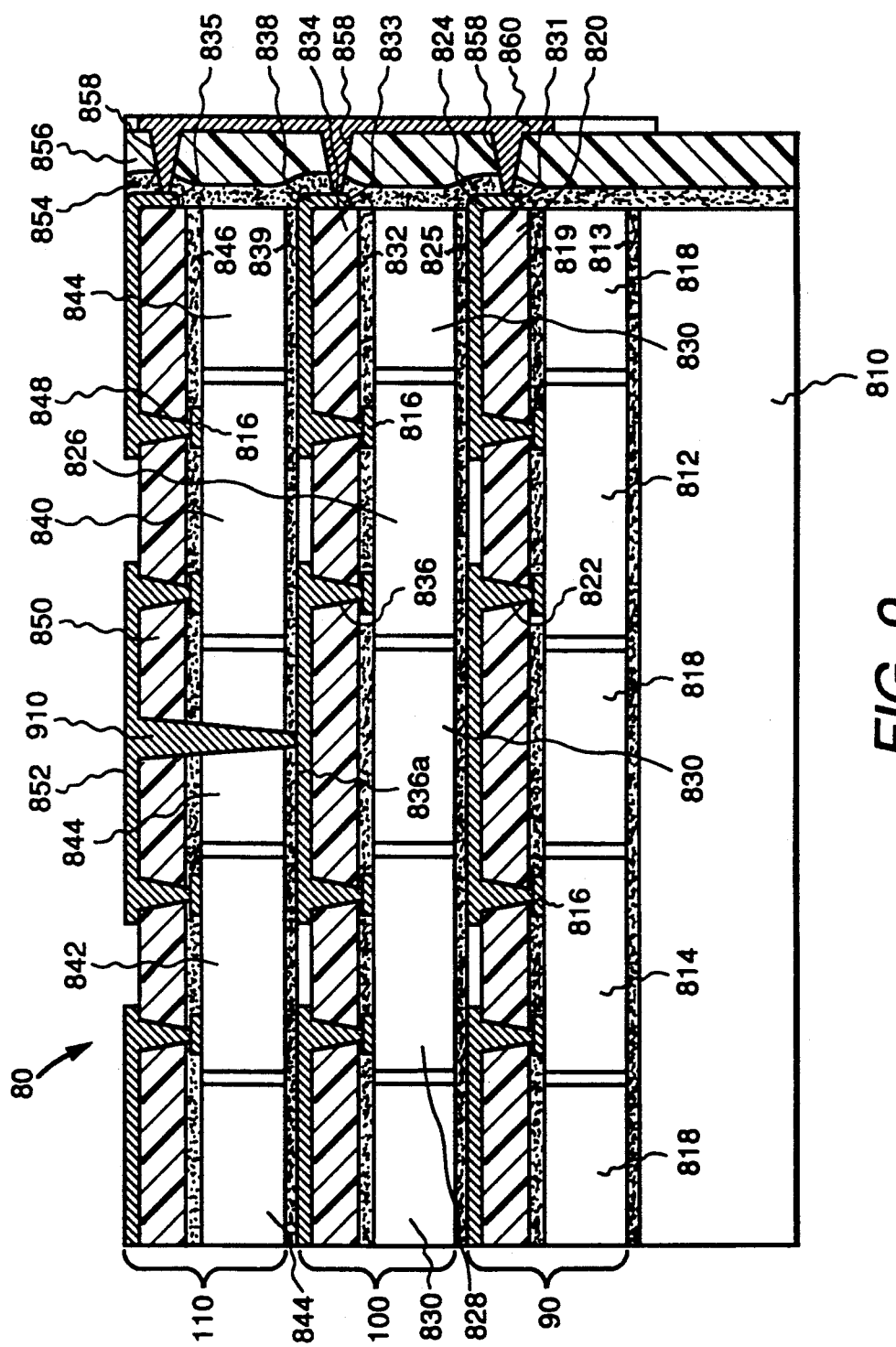
FIG. 9 is a cross-sectional view of a stacked lightweight packaged electronic system that includes thinned dice produced by the process of a preferred embodiment of the invention showing interlevel via for stack interconnect.

FIG. 9 illustrates an alternative method of stack assembly and interconnect. Layer 110 is a completed high density interconnect layer produced according to a preferred embodiment of this invention. Layer 110 is resin-attached to layer 100 by resin layer 839. A laser milled via 910 is inserted through polymer layers 850, 844 and 839 down to metal trace 836a. Via 910 is metallized and patterned simultaneously with conductor 852 and via openings 848. Via 910 interconnects trace conductors 852 and 836a by internal inter-planer via connections.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of thinning dice for use in a packaged electronic system comprising:

positioning a plurality of said dice in a die carrier layer;

bonding a polymer film to said die carrier layer having said plurality of dice positioned therein;

affixing a holding layer to said polymer film;

attaching said holding layer to a material removal device;

selecting a desired thickness less than an initial thickness of at least one of said plurality of dice;

removing an expendable portion of at least some of said plurality of dice to decrease thickness of said at least some of said plurality of dice to said desired thickness, while simultaneously removing a portion of said die carrier layer; and detaching said holding layer from said polymer film.

2. The method of claim 1 wherein said die carrier layer comprises a removable material selected from the group consisting of alumina, polymer, metal and metal alloy.

3. The method of claim 1 wherein said holding layer comprises a material selected from the group consisting of metal, polymer and alumina.

4. The method of claim 3 wherein said metal is magnetic.

5. A method of producing a lightweight packaged electronic system comprising:

positioning a plurality of dice in a die carrier layer such that contact pads of said plurality of dice are coplanar with a face of said die carrier layer;

bonding a flexible polymer dielectric film to said face of said die carrier layer and to said plurality of dice;

affixing a holding layer to said flexible polymer dielectric film;

attaching said holding layer to a material removal device;

selecting a desired thickness less than an initial thickness of at least one of said plurality of dice;

removing from the exposed side of said die carrier layer an expendable portion of said die carrier layer along with an expendable portion of at least some of said plurality of dice to decrease thickness of both said at least some of said plurality of dice and said die carrier layer to said desired thickness;

bonding a substrate to the thinned side of said die carrier layer;

removing said holding layer from said flexible polymer dielectric film; and depositing a pattern of flexible conductors on said flexible polymer dielectric film to electrically interconnect at least some of said contact pads of said plurality of dice.

6. A method of producing a lightweight flexible packaged electronic system comprising:

positioning a plurality of dice in a die carrier layer such that contact pads of said plurality of dice are coplanar with a face of said die carrier;

bonding a flexible polymer dielectric film to said face of said die carrier layer and to said plurality of dice;

affixing a holding layer to said flexible polymer dielectric film;

attaching said holding layer to a material removal device;

selecting a desired thickness less than an initial thickness of at least one of said plurality of dice;

removing from the exposed side of said die carrier layer an expendable portion of said die carrier layer and an expendable portion of at least some of said plurality of dice to decrease thickness of said at least some of said plurality of dice to said desired thickness;

separating said die carrier layer from said flexible polymer dielectric film and said plurality of dice;

bonding a substrate to said plurality of said dice;

removing said holding layer from said flexible polymer dielectric film; and depositing a pattern of flexible conductors on said flexible polymer dielectric film to electrically interconnect at least some of said contact pads of said plurality of dice.

7. The method of claim 6 further comprising bonding spacer members to said flexible polymer dielectric film for providing structural strength to said packaged electronic system.

8. The method of claim 6 further comprising mounting on the exposed surface of said flexible polymer dielectric film having said pattern of flexible conductors thereon a temperature-sensitive die.

9. The method of claim 6 wherein said substrate is provided with a curvature.

10. The method of claim 6 wherein at least one of said plurality of dice comprises a dummy spacer die.

11. A method of producing a lightweight flexible packaged electronic system having process temperature-sensitive dice therein comprising;

positioning in a die carrier layer a plurality of dice, some of which comprise dummy spacer dice of the same size as said process temperature-sensitive dice, such that contact pads of said plurality of dice are coplanar with a face of said die carrier layer;

bonding a flexible polymer dielectric film to said face of said die carrier layer and to said plurality of dice positioned in said die carrier layer;

affixing a holding layer to said flexible polymer dielectric film;

attaching said holding layer to a material removal device;

selecting a desired thickness less than an initial thickness of at least one of said plurality of dice;

removing from the exposed side of said die carrier layer an expendable portion of said die carrier layer and an expendable portion of at least some of said plurality of dice positioned in said die carrier layer to decrease the thickness of said at least some of said plurality of dice to said desired thickness;

separating said die carrier layer from said flexible polymer dielectric film and said plurality of dice bonding a substrate to said plurality of dice;

removing said holding layer from said flexible polymer dielectric film;

depositing a pattern of flexible conductors on said flexible polymer dielectric film to electrically interconnect at least some of said contact pads of said plurality of dice; and replacing said dummy spacer dice in said die carrier layer with said process temperature-sensitive dice.

12. The method of claim 11 wherein said substrate is provided with a curvature.

13. A method of producing a stacked lightweight packaged electronic system comprising;

positioning a plurality of dice in a die carrier layer such that contact pads of said plurality of dice are coplanar with a face of said die carrier layer;

bonding a polymer dielectric film to said face of said die carrier layer and to said plurality of dice;

affixing a holding layer to said polymer dielectric film;

attaching said holding layer to a material removal device;

selecting a desired thickness less than an initial thickness of at least one of said plurality of dice;

removing from the exposed side of said die carrier layer an expendable portion of said die carrier layer and an expendable portion of at least some of said plurality of dice to decrease thickness of said at least some of said plurality of dice and said die carrier layer to said desired thickness;

attaching a temporary transfer substrate to the thinned side of said die carrier layer;

removing said holding layer from said polymer dielectric film;

perforating said dielectric film to form via openings therein in alignment with at least some of said contact pads;

depositing on said polymer dielectric film a pattern of conductors having edge contact pads to electrically interconnect at least some of said contact pads of said plurality of dice;

removing said temporary transfer substrate to form a high density interconnect layer;

coating a top and bottom surface of said high density interconnect layer with an adhesive layer;

stacking said high density interconnect layer with at least one additional high density interconnect layer such that for any adjacent pair of said high density interconnect layers, said adhesive layers bond the top surface of one of said high density interconnect layers to the bottom surface of the other of said high density interconnect layers so as to form a unitary stacked module;

bonding a substrate to the bottom surface of the lowermost high density interconnect layer;

bonding a dielectric layer to at least one side of said stacked module having said edge contacts exposed thereon;

perforating said dielectric layer on said at least one side of said stacked module to form apertures therein in alignment with at least some of said edge contact pads; and depositing a conductive metal track structure on said dielectric layer on said at least one side of said stacked module to provide electrical connection between at least some of said edge contact pads through said apertures in said dielectric layer situated on said at least one side of said stacked module, said metal track structure electrically interconnecting in a predetermined manner said dice positioned in said high density interconnect layers of said stacked module.

14. A method of producing a plurality of dice suitable for use in mass production of a packaged electronic system comprising:

positioning said plurality of dice in a die carrier layer;

bonding a polymer film to said die carrier layer having said plurality of dice positioned therein;

affixing a holding layer to said polymer film;

attaching said holding layer to a material removal device;

selecting a desired thickness less than an initial thickness of at least one of said plurality of dice;

removing a portion of said die carrier layer along with an expendable portion of at least some of said dice to decrease the thickness of said at least some of said dice to said desired thickness;

removing the remaining portion of said die carrier layer; and detaching said dice having uniform thickness from said polymer film.

15. The method of claim 1 wherein each one of said dice has contact pads and the step of positioning said dice in said die carrier layer comprises pouring material for said die carrier layer around said dice so that said contact pads are coplanar with a face of said die carrier layer.

* * * * *